United States Patent
Peterson et al.

(12) 
(10) Patent No.: US 6,379,988 B1
(45) Date of Patent: Apr. 30, 2002

(54) PRE-RELEASE PLASTIC PACKAGING OF MEMS AND IMEMS DEVICES

(75) Inventors: Kenneth A. Peterson, Albuquerque; William R. Conley, Tijeras, both of NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/572,720

(22) Filed: May 16, 2000

(51) Int. Cl.$^7$ .......................... H01L 21/00; H01L 21/44; H01L 21/48
(52) U.S. Cl. ............................ 438/51; 438/55; 438/64; 438/106; 438/115; 438/116; 438/125
(58) Field of Search .............................. 438/51, 55, 64, 438/106, 115, 116, 125, 126, 127, 759

(56) References Cited

U.S. PATENT DOCUMENTS

| | | | |
|---|---|---|---|
| 5,471,087 A | * 11/1995 | Buerger, Jr. | 257/532 |
| 5,773,323 A | 6/1998 | Hur | 438/123 |
| 5,855,727 A | * 1/1999 | Martin et al. | 156/345 |
| 5,863,810 A | 1/1999 | Kaldenberg | 438/27 |
| 5,897,338 A | 4/1999 | Kaldenberg | 438/116 |
| 5,932,061 A | * 8/1999 | Lam | 156/345 |
| 6,069,392 A | * 5/2000 | Tai et al. | 257/419 |
| 6,136,212 A | * 10/2000 | Mastrangelo et al. | 216/49 |

OTHER PUBLICATIONS

B&G International Product Brochure for Dual Acid System.
Jeffrey T. Butler, Victor M. Bright, John H. Comtois, Multichip Module Packaging of Microelectromechanical Systems, Elsevier Science S.A., Sensors and Actuators A 70 (1998) 15–22.
A. Morrissey, G. Kelly, J. Alderman, Low–stress 3D Packaging of a Microsystem, Elsevier Science S.A., Sensors and Actuators A68 (1998) 404–409.
Margaret L. Kniffin, Mahesh Shah, Packaging for Silicon Micromachined Accelerometers, The International Journal of Microcircuits and Electronic Packaging, vol. 19, No. 1, First Quarter 1996 (ISSN 1063–1674).
C. Cotofana, A. Bossche, P. Kaldenberg, J. Mollinger, Low–cost Plastic Sensor Packaging Using the Open–Window Package Concept, Elsevier Science S.A., Sensors and Actuators A 67 (1998) 185–190.
Balaji Sridharan, Chang–Jin "C J" Kim and Long–Sun Huang, Post–Packaging Release a New Concept for Surface–Micromachined Devices, Tech. Dig., Solid–State Sensor and Actuator Workshop, Hilton Head, SC, Jun. 1998, pp. 225–228.

* cited by examiner

Primary Examiner—Matthew Smith
Assistant Examiner—Lex H. Malsawma
(74) Attorney, Agent, or Firm—Robert D. Watson

(57) ABSTRACT

A method is disclosed for pre-release plastic packaging of MEMS and IMEMS devices. The method can include encapsulating the MEMS device in a transfer molded plastic package. Next, a perforation can be made in the package to provide access to the MEMS elements. The non-ablative material removal process can include wet etching, dry etching, mechanical machining, water jet cutting, and ultrasonic machining, or any combination thereof. Finally, the MEMS elements can be released by using either a wet etching or dry plasma etching process. The MEMS elements can be protected with a parylene protective coating. After releasing the MEMS elements, an anti-stiction coating can be applied. The perforating step can be applied to both sides of the device or package. A cover lid can be attached to the face of the package after releasing any MEMS elements. The cover lid can include a window for providing optical access. The method can be applied to any plastic packaged microelectronic device that requires access to the environment, including chemical, pressure, or temperature-sensitive microsensors; CCD chips, photocells, laser diodes, VCSEL's, and UV-EPROMS. The present method places the high-risk packaging steps ahead of the release of the fragile portions of the device. It also provides protection for the die in shipment between the molding house and the house that will release the MEMS elements and subsequently treat the surfaces.

88 Claims, 13 Drawing Sheets

PRE-RELEASE PLASTIC PACKAGING OF MEMS AND IMEMS DEVICES

FEDERALLY SPONSORED RESEARCH

The United States Government has rights in this invention pursuant to Department of Energy Contract No. DE-AC04-94AL85000 with Sandia Corporation.

CROSS-REFERENCE TO RELATED APPLICATIONS

None Applicable

BACKGROUND OF THE INVENTION

This invention relates generally to the field of microelectronics and more specifically to plastic packaging of microelectromechanical systems (MEMS) and integrated microelectromechanical systems (IMEMS) devices.

Examples of MEMS and IMEMS devices include airbag accelerometers, microengines, optical switches, gyroscopic devices, sensors, and actuators. For current commercially packaged MEMS and IMEMS components, the steps of packaging and testing can account for at least 70% of the cost. Also, the current low-yields of MEMS packaging are a "show-stopper" for the eventual success of MEMS. Conventional electronic packaging methods, although expensive, are not presently adequate to carry these designs to useful applications with acceptable yields and reliability.

Current packaging methods first release the MEMS elements at the wafer scale, followed next by probe testing. Unfortunately, probed good MEMS are often lost in significant quantity due to damage during subsequent packaging steps. These subsequent steps include die separation, die attach to the package, wirebonding (or other interconnection methods), and sealing with hermetic or dust protection lids. Electrostatic effects, moisture, and rough handling can damage the fragile MEMS elements or wirebonds. There is a need to ruggedize the MEMS elements and wirebonds against damage during each of these packaging steps. Herein, the word "wafer" can include silicon; gallium arsinide (GaAs); or quartz wafers or substrates (e.g. for MEMS structures).

At some stage in the fabrication process the MEMS elements must be released (e.g. made functional) by etching away a sacrificial, protective layer of silicon dioxide or silicate glass that surrounds the MEMS elements. Typically, this is done at the wafer scale. A typical wet release procedure includes acid etching in hydrofluoric or hydrochloric acid, followed by rinsing and drying. Alternatively, dry plasma etching with chemically active ions, such as oxygen, chlorine, or fluorine ions, can be used. It is critical that the release process does not damage other features on the MEMS or IMEMS device, such as metal interconnects. Dry etching processes are generally less damaging to the fragile MEMS elements than wet processes, but can take more time to complete. A desirable goal is to postpone the release step until the last possible moment.

Many different types of microelectronic devices require an opening in the protective package that exposes a sensitive or active area to the surrounding environment. For example, MEMS elements (e.g. gears, hinges, levers, slides, mirrors, optical sensors, chemical sensors, etc.) must not be encapsulated in plastic because these free-standing structures must be able to move, rotate, etc. Also, MEMS packages can require optical access through a window to permit viewing and inspection for calibration and performance characterization of operating MEMS elements.

Likewise, microsensors that have chemically sensitive, pressure-sensitive, or temperature-sensitive areas (sometimes combined with IC's, CMOS or Bipolar chips, etc.) must be freely exposed to the environment through an opening or openings in the plastic package. Finally, optically active microelectronic devices can require optical access through an opening in the plastic package (the package may, or may not, have a window attached across the opening). Examples of optically active devices include charge coupled devices (CCD), photocells, laser diodes, vertical cavity surface emitting lasers (VCSEL's), and UV erasable programmable read-only memory chips (UV-EPROM's). While some of these devices emit light, and while others receive light; both are considered to be "optically active".

Therefore, some method of creating an opening in the plastic package is needed for these types of microelectronic devices.

Butler, et al. disclose a method of creating an opening in a plastic package using laser ablation to vaporize and cut a window through a 60 micron thick protective dielectric layer (e.g. 2 layers of Kapton film bonded with thermoplastic adhesive), thereby exposing the unreleased MEMS device or microsensor to the environment. See J. T. Butler, V. M. Bright, and J. H. Comtois, "Multichip Module Packaging of Microelectromechanical Systems", Sensors and Actuators A 70 (1998) 15–22. In the same reference, Butler, et al. disclose using a two-step process where the majority of the protective layer is removed by a high-power laser, followed by removing the remaining thin layer by using a low-power laser, or by using a plasma etching process. Then, after creating the opening, a conventional release etch can be performed to release the MEMS elements.

A problem with using an ablative process (e.g. laser ablation) to create an opening in a plastic package is potential damage to MEMS elements (or other sensitive surfaces) caused by overheating, and fracture or warping due to thermal stresses. Accurate control is required to prevent accidentally cutting through the protective layer and damaging the sensitive area below. Another potential problem is unwanted deposition of laser-ablated debris on to adjoining surfaces. Finally, the rate that material can be removed by laser ablation or dry plasma etching is generally much slower than that which can be achieved by non-ablative methods, including acid (e.g. wet) etching, mechanical machining, water jet cutting, vacuum or thermal processing methods.

In U.S. Pat. No. 5,897,338, Kaldenberg teaches a method for encapsulating an integrated semi-conductor circuit (die) comprising the following steps: a) mounting the semi-conductor circuit onto the surface of a lead frame, b) attaching connecting wires between the contact surfaces of the semi-conductor circuit and selected parts of the lead frame (bonding operation), c) by means of a mould producing a plastic housing which at least encapsulates the semi-conductor circuit, the supporting surface, the bonding wires and part of the lead frame, wherein d) the mould comprises an inwards extending section of which the end surface in the closed situation of the mould extends parallel to the free upper side of the integrated semi-conductor circuit at short distance thereof, and e) before closing the mould a layer of heat resistant deformable material in the form of a ring or a continuous layer is brought in between the upper side of the integrated semi-conductor circuit and the end surface of the inwards extending part, which layer not or hardly adheres to the plastic housing. The combination of the inwards extending part and the ring or layer of deformable material serve together to completely exclude any encapsulant from touching the surface of the IC, and serve to exclude any encapsulant from flowing into the volume directly above the designated surface area of the IC.

Kaldenberg does not discuss in the '338 patent any application of his method to packaging of MEMS or IMEMS devices. However, if Kaldenberg's method of the '338 patent were to be applied to packaging of MEMS or IMEMS device, potential problems could include: damaging the MEMS elements if the inwards extending section is pushed down too hard; sticking of the deformable material to the MEMS surface; and sticking of the encapsulant to the inwards extending section.

The present invention differs from Kaldenberg's '338 patent in at least two ways. Firstly, in the present invention, the opening in the plastic package is created by physically removing (e.g. perforating) the encapsulant in a volume located above the sensitive area (e.g. "designated area of the IC"). Kaldenberg, on the other hand, never allows any of the flowable encapsulant to fill-in this volume because his patent teaches the step of inserting an excluding member through a hole in the top of the transfer mold frame prior to encapsulating.

Secondly, in the present invention, encapsulant is allowed to flow across the face of the designated area of the IC. Kaldenberg, on the other hand, teaches the use of a deformable ring or layer placed in contact with the surface of the IC to specifically prevent the flow of encapsulant across the face of the designated area. If Kaldenberg's '338 method were to be used without using the deformable ring or layer, then some encapsulant would flow across the face of the designated surface area of the IC; thereby defeating the purpose of Kaldenberg's invention, namely, to provide complete access to the IC after molding, without the need to perform any additional material removal steps. Kaldenberg does not teach or suggest in the '338 patent any method, or means for, removing encapsulant material which may have flowed across the face of the IC. Kaldenberg uses the deformable ring or layer to prevent such a flow from occurring, thereby obviating the need for removing encapsulant after the molding step.

In the present invention, a perforation is created in an electrically insulating material above the sensitive area. A commercial device currently exists for this purpose. Conventionally called a "decapsulator", or "jet etcher", such a device removes plastic material by directing a stream of heated acid etchant perpendicular to the surface being etched. A gasket can be used to confine the area being etched. Conventional etching solutions comprise fuming nitric acid, fuming sulfuric acid, or mixtures of the two acids. The etching solutions can be heated to 250° C., and +/−1% temperature control is provided. An example of a decapsulator device is the "D Cap-Delta" dual acid system sold by B&G International, Santa Cruz, Calif., 95060.

Commercially available decapsulators are used for creating an opening in plastic packages to expose an integrated circuit (IC) contained therein. The etching solutions described above preferentially dissolve common plastic compounds, including epoxy resin, without attacking the underlying integrated circuit. Reasons for decapsulating the package include inspection, testing, failure analysis, and repair. Visual inspection can confirm the integrity of wirebond connections. Probe pins can be placed onto the exposed surface pads to test the operation of the IC (e.g. probe test). It is also desirable to test IC's while the package is still mounted to the printed circuit board. Failure analysis also requires a method of opening up selected portions of a microelectronic device potted in plastic. Finally, damaged wirebond connections can be repaired, once the broken connection is exposed.

Commercially available decapsulators are not presently used to create an opening in plastic packages or covers for the purpose of exposing released (or unreleased) MEMS devices. They are also not presently used for the purpose of "activating" microsensors, e.g. by exposing the active sensor area freely to the surrounding environment. Decapsulators are also not presently used to create an opening for providing optical access to optically active areas on integrated circuits (e.g. CCD chips and UV-EPROMS).

What is desired is a method that provides a low-cost, high-yield, and high-capacity commercial packaging technique that releases the MEMS elements after covering or encapsulating the MEMS or IMEMS devices, delicate wirebonds, other electrical interconnections, and die attachments in a hardened plastic material. What is also desired is to minimize the number of processing steps that are performed after releasing the MEMS elements, in order to minimize the risk of damaging the fragile MEMS elements. It is also desired to use a material removal process that can create an opening in a plastic protective layer, without damaging the underlying sensitive area underneath (e.g. IC's, MEMS elements, or sensor elements).

The present invention solves these problems by firstly creating an opening in the plastic protective layer by using a non-ablative material removal process, which exposes the sensitive area to the surrounding environment; and, secondly, releasing any MEMS elements by wet or dry etching the unreleased MEMS device with access provided by the opening created in the plastic cover.

Throughout this application, use of the word "MEMS" is intended to also include "IMEMS" devices, unless specifically stated otherwise. Likewise, the word "plastic" is intended to also broadly include any type of flowable dielectric composition.

The present method places the high-risk packaging steps ahead of the release of the fragile portions of the device. It also provides protection for the die in shipment between the molding house and the house that will release the MEMS elements and subsequently treat the surfaces. This packaging scheme is very inexpensive compared to placing a device in a discrete package. It permits one to obtain large numbers of functional devices for performance evaluation and debugging of designs. It lets the devices go through any rough handling or environments associated with packaging while still protected in encapsulating plastic. Adhesion problems, such as during die attach, are minimized because surfaces have not yet been treated with proprietary materials. This method can be used for inserting MEMS/IMEMS devices into existing commercial IC plastic packaging lines with minimal impact, thereby minimizing costs.

BRIEF DESCRIPTION OF THE DRAWINGS

The accompanying drawings, which are incorporated in and form part of the specification, illustrate various embodiments of the present invention and, together with the description, serve to explain the principles of the invention.

DETAILED DESCRIPTION OF THE INVENTION

The present invention relates to a method for activating at least one sensitive area of a microelectronic device, comprising the steps of providing a microelectronic device having at least one sensitive area substantially covered by an electrically insulating material; and perforating the insulating material in a location above the sensitive area by using a non-ablative material removal process; whereby the sensitive area becomes exposed to the surrounding environment.

In this context, the word "activating" comprises at least three meanings. Firstly, "activating" can mean creating an opening in the insulating material to freely expose an active sensing area of the microelectronic device to the surrounding environment. Examples of an active sensing area include a chemical sensing area, a pressure sensing area, and a temperature sensing area, or a combination thereof. Secondly, "activating" can mean providing an opening in the insulating material to allow optical access to optically active areas, (e.g. CCD chips, photocells, laser diodes, VCSEL's, and UV-EPROM's). Thirdly, "activating" can mean providing an opening in the insulating material to allow access for performing a step of releasing any unreleased MEMS elements in the microelectronic device.

Figure 1A:
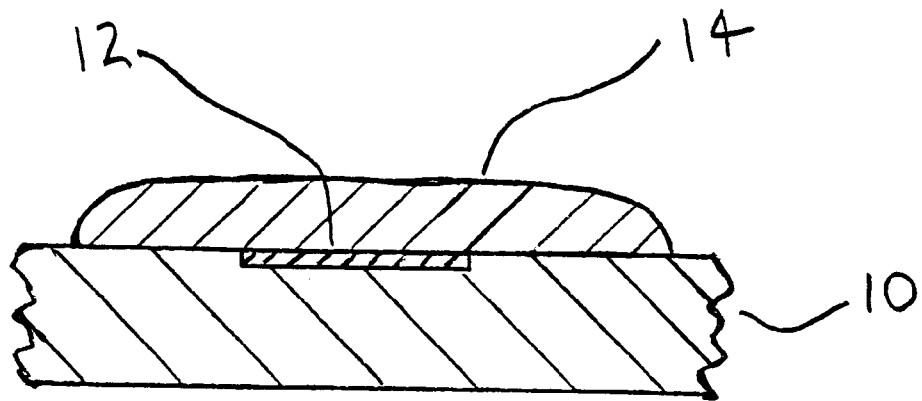
FIG. 1A shows a schematic cross-section view of a first example, according to the present invention, of a microelectronic device having a sensitive area substantially covered by an electrically insulating material.

FIG. 1A shows a schematic cross-section view of a first example of a microelectronic device 10 having a sensitive area 12 substantially covered by an electrically insulating material 14, according to the present invention.

Figure 1B:
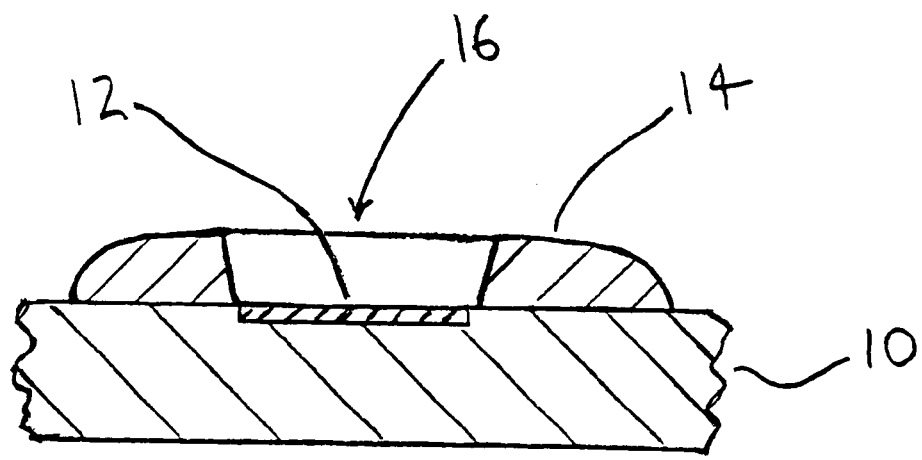
FIG. 1B shows a schematic cross-section view of a first example, according to the present invention, of a microelectronic device having a sensitive area after perforating the insulating material, thereby exposing the sensitive area.

FIG. 1B shows a schematic cross-section view of a first example according to the present invention, similar to FIG. 1A, wherein an opening 16 has been made in material 14 by perforating material 14 in a region located above sensitive area 12. Opening 16 exposes the sensitive area 12 to the surrounding environment, thereby activating the sensitive area.

The method of perforating the electrically insulating material 14 in FIG. 1B can include any non-ablative material removal process. The non-ablative material removal process can include mechanically machining (e.g. drilling, milling, and grinding), water jet cutting, ultrasonically machining with an abrasive fluid, wet etching, dry etching cutting, vacuum or thermal processing methods.

Figure 2A:
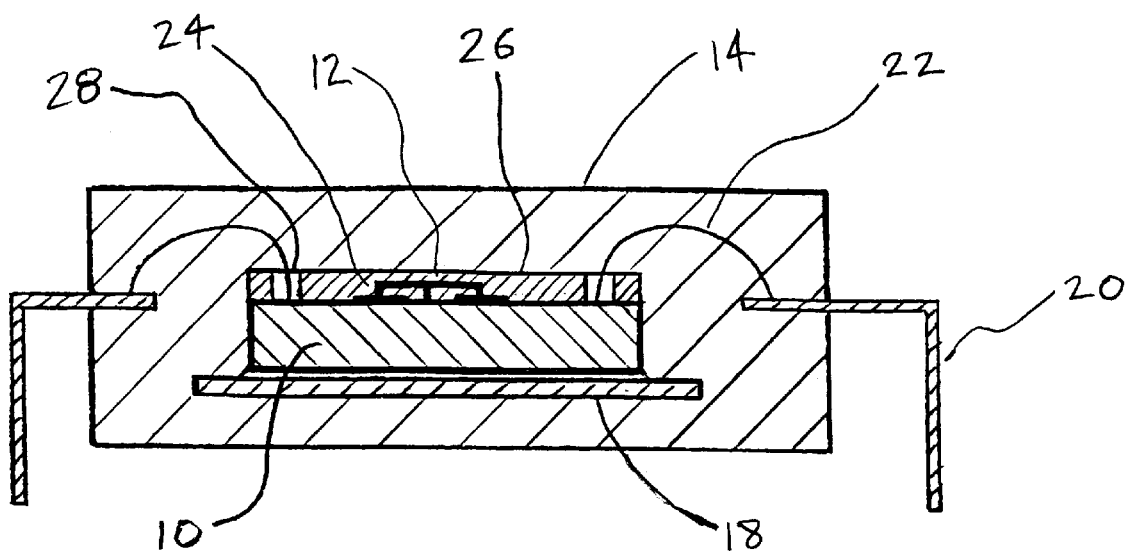
FIG. 2A shows a schematic cross-section view of a second example, according to the present invention, of an unreleased MEMS device that has been die-attached to a paddle, wirebonded to a lead frame, and encapsulated in a molded plastic package.

FIG. 2A shows a schematic cross-section view of a second example, according to the present invention, of an unreleased MEMS device 10 that has been die-attached to a paddle 18, wirebonded 22 to a lead frame 20, and encapsulated in a plastic package 14 by transfer molding. Device 10 can include unreleased MEMS elements 24, meaning that elements 24 are surrounded by a sacrificial protective layer 26, which can be made of silicon dioxide, silicate glass, or vapor-deposited polymer (e.g. parylene). Wirebonds 22 can be attached to bond pads (not shown) on the surface of device 10. These bond pads have been exposed by cutting vias 28 through protective layer 26 with a laser, or other tool, as is well-known in the art. In this example, sensitive area 12 can include MEMS elements 24.

Figure 2B:
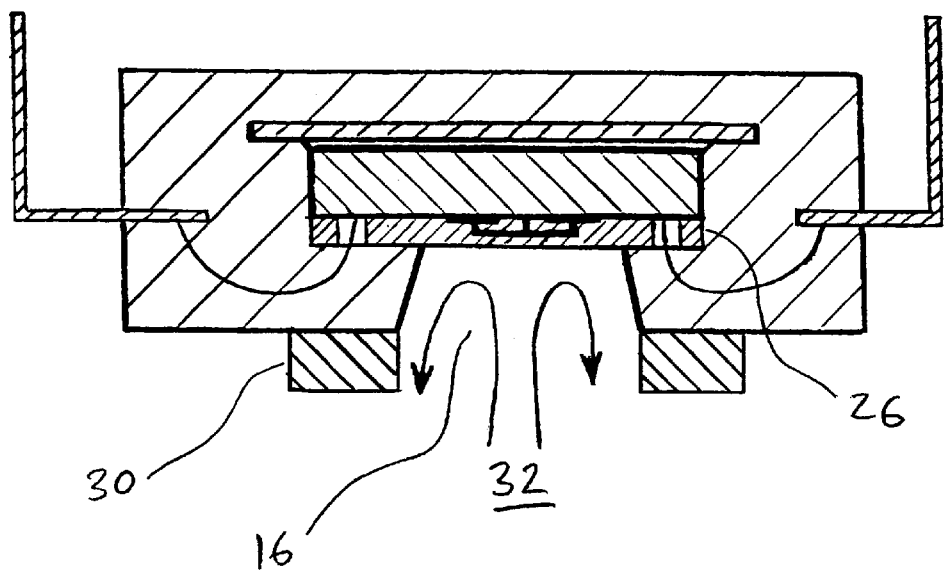
FIG. 2B shows a schematic cross-section view of a second example, according to the present invention, of an unreleased MEMS device, held upside down, where the plastic package can be perforated with an acid etching solution, confined by an external gasket.

FIG. 2B shows a schematic cross-section view of a second example, according to the present invention, that is similar to FIG. 2A, where the plastic package 14 can be perforated by directing a stream of a first acid etching solution 32 in a direction substantially perpendicular to the surface of package 14. An external gasket 30 can be used to confine the spray of acid 32. It is important to limit the etching process to only the zone of perforation 16 so that other members (e.g. wirebonds 22) aren't unintentionally set free by removing plastic from adjacent regions. Package 14 is held upside down so that fluid and waste debris fall down and away from sensitive area 12, thereby reducing the potential for contamination.

Solutions used for etching plastic (e.g. epoxy resin) conventionally comprise fuming nitric acid, fuming sulfuric acid, or mixtures of the two acids. Preferred etching fluids include heated fuming nitric acid at about 80–100 C for etching NOVOLAC type epoxies, and heated fuming sulfuric acid at about 230–260 C, or non-fuming sulfuric acid at about 230–260 C for etching glob-top polymer compositions. Polymer compositions can be etched by other solvents, as well. Also, if the encapsulant material is water-soluble, then water can be used as the etching fluid.

A commercial device currently exists for the purpose of creating an opening 16 in a plastic package 14. Conventionally called a "decapsulator", or "jet etcher", such a device removes plastic material by directing a stream of heated acid etchant perpendicular to the surface being etched. A gasket can be used to confine the area being etched. Conventional etching solutions comprise fuming nitric acid, fuming sulfuric acid, or mixtures of the two acids. The etching solutions can be heated to 250 C, and +/−1% temperature control is provided. An example of a decapsulator device is the "D Cap-Delta" dual acid system sold by B&G International, Santa Cruz, Calif., 95060. Other decapsulating devices are also described in U.S. Pat. No. 5,855,727 to Martin, et al., and in U.S. Pat. No. 5,932,061 to Lam.

Nitric acid and sulfuric acid are both attractive etching solutions because they typically do not attack or damage the underlying integrated circuit. Importantly, they also do not attack (e.g. etch) the sacrificial layer of silicon dioxide or silicate glass which typically surrounds the MEMS elements. This is particularly avantageous because the wet etching process can be allowed to proceed at a high rate to 100% perforation of the plastic encapsulant 14, without concern for accidentally damaging the underlying silicon dioxide or silicate glass sacrificial layer (unlike ablative processes, such as laser ablation).

Alternatively, plastic package 14 can be perforated by a dry process (e.g. a plasma etching process, a reactive ion etching process, or an ion milling process). Each of these dry etching processes can use a chemically active ion (e.g. oxygen, chlorine, and fluorine). Plasma etching processes are well-known to those skilled in the art.

In another embodiment of the present invention, the non-ablative step of perforating plastic package 14 can be performed in more than one stage. For example, using a two-stage process, the majority of the thickness of the plastic layer 14 can be first removed by a fast removal process. This can comprise using a wet acid etching solution with a high velocity jet stream. Or, it can comprise mechanical machining with a high-speed milling tool. Then, in the second stage, a much slower process can be used to remove the remaining thin layer of plastic 14. Examples of slower processes can include wet etching with a low-velocity stream, or with a stream of a dilute concentration of acid product. Dry plasma etching can also be used, which is typically a slower process. The primary reason for switching to a much slower process at the final stage of perforation is to remove the last amount of plastic using a gentle process. This minimizes the possibility of accidentally damaging the sensitive area underneath.

Figure 2C:
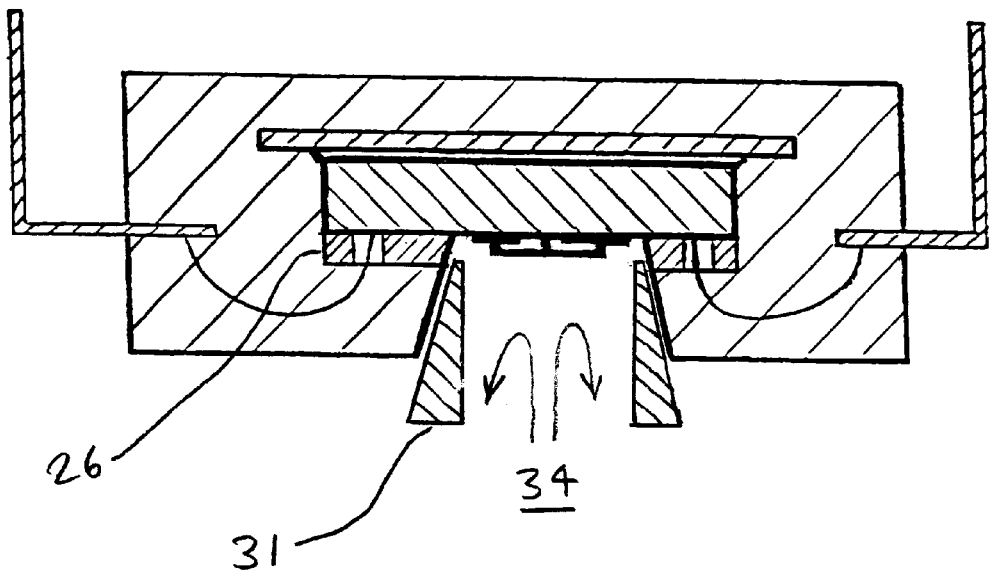
FIG. 2C shows a schematic cross-section view of a second example, according to the present invention, of an unreleased MEMS device, held upside down, where the MEMS elements are being released by dissolving the sacrificial glass layer with an acid etching solution, confined by an internal gasket.

FIG. 2C shows a schematic cross-section view of a second example, according to the present invention, that is similar to FIG. 2B, where the MEMS elements 24 are being released by dissolving the sacrificial glass layer 26 with a second acid etching solution 34, confined by an optional internal gasket 31. This step is also conventionally called a release step, because after the MEMS elements 24 are "released", they are then free to move, rotate, tilt, etc. Releasing by wet etching can include using an acid solution comprising hydrochloric acid, hydrofluoric acid, or any combination thereof. After wet etching, MEMS elements 24 can be dried by methods that can reduce unwanted stiction, including sublimation and supercritical drying, as is well-known to those skilled in the art.

Alternatively, MEMS elements 24 can be released by a dry process, such as plasma etching (in the manner as described above). Dry plasma etching can also be used to release MEMS elements that can be protected by a sacrificial coating of a water-insoluble, vacuum-deposited carbon-based, parylene-type organic polymer coating or silicon nitride coating. Parylene is a generic name for thermoplastic polymers based on poly-para-xylyene monomers, and have low dielectric constants, low water affinity, low film stress, high electrical resistivity, are inert to organic solvents, including water, and may be conformally deposited from the vapor state without solvents or high temperature cures. In this embodiment, a parylene coating can replace the conventional sacrificial layer of silicon dioxide or silicate glass.

After releasing the MEMS elements 24 in FIG. 2C, optional coatings can be applied to the released MEMS elements 24 in order to reduce friction, improve performance, and increase the lifetime of these moving components. One advantage of waiting until this stage in the fabrication process to apply anti-stiction coatings is that there is no concern with possible contamination of the backside of the MEMS device die, or the bonding pads, with anti-stiction coatings (since the MEMS die have already been attached to the paddle 18 and encapsulated in plastic). This is not the case when anti-stiction coatings are applied at the wafer scale (after wafer-scale release). The subsequent removal of these unwanted coatings on the backside of the wafer can damage or contaminate the released MEMS elements. Likewise, application of coatings to the wafer backside that are designed to promote or enable the die attachment process may similarly damage the released MEMS elements by adsorption of harmful materials.

Those skilled in the art will understand that the release step illustrated in FIG. 2C would not need to be performed if the sensitive area 12 of device 10 did not have any unreleased MEMS elements 24.

Figure 2D:
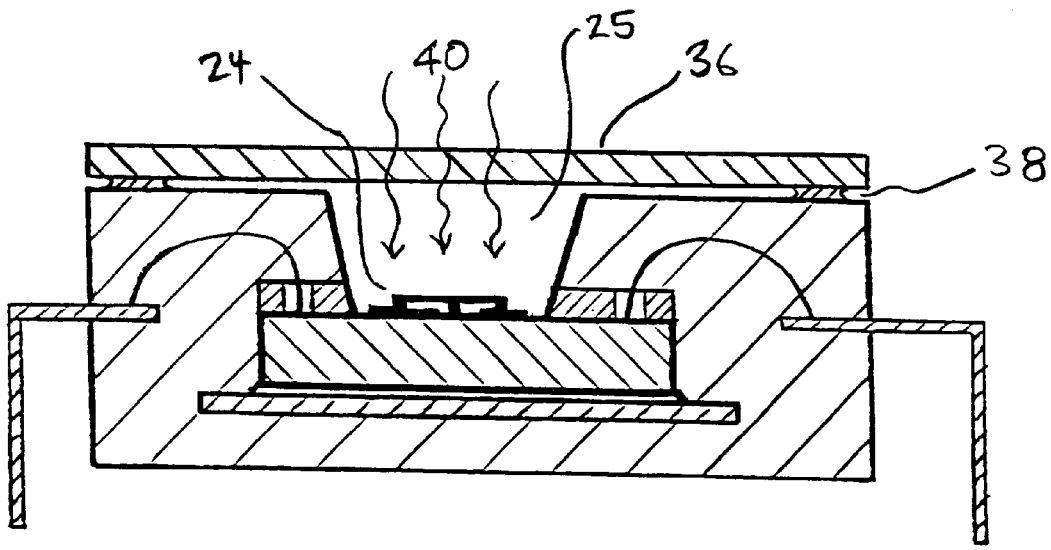
FIG. 2D shows a schematic cross-section view of a second example, according to the present invention, of a released MEMS device that is protected in a sealed cavity by an attached window that provides optical access to the MEMS device.

FIG. 2D shows a schematic cross-section view of a second example, according to the present invention, that is similar to FIG. 2C, of a released MEMS device 24 that can be protected in a sealed cavity 25 by an attached window 36 that provides optical access 40 to the MEMS device. Window 36 can be attached to plastic package 14 by polymer seal 38. Alternatively, an opaque cover lid (not shown) can be attached in place of window 36, to provide dust and environmental protection to released MEMS device 24. A window 36 or cover lid would not be used if open-access to the surrounding environment is required, e.g., for a chemically-sensitive or pressure-sensitive microsensor. The other structures (e.g. wirebonds 22) remain safely encapsulated inside of plastic molded package 14.

Figure 3A:
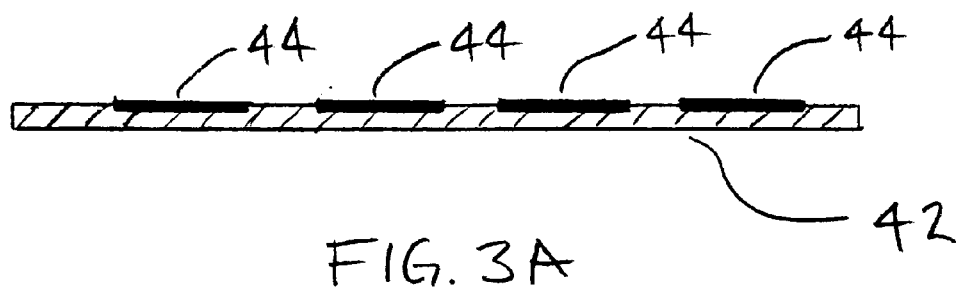
FIG. 3A shows a schematic cross-section view of a third example, according to the present invention, of a wafer with multiple integrated circuit modules, each having a sensitive area.

FIG. 3A shows a schematic cross-section view of a third example, according to the present invention, of a wafer 42 with multiple integrated circuit modules 44, each having a sensitive area 12. Sensitive area 12 can be an active sensing area, an optically-active area, or can comprise MEMS elements in a MEMS or IMEMS device. Active sensing area can be a chemical sensing area, a pressure sensing area, or a temperature sensing area, or a combination thereof. Optically-active areas can be CCD chips, photocells, laser diodes, VCSEL's, and UV-EPROM's, or a combination thereof. CMOS or Bipolar integrated circuits can be combined with sensitive area 12 to form an integrated microelectronic device including a sensitive area 12.

Figure 3B:
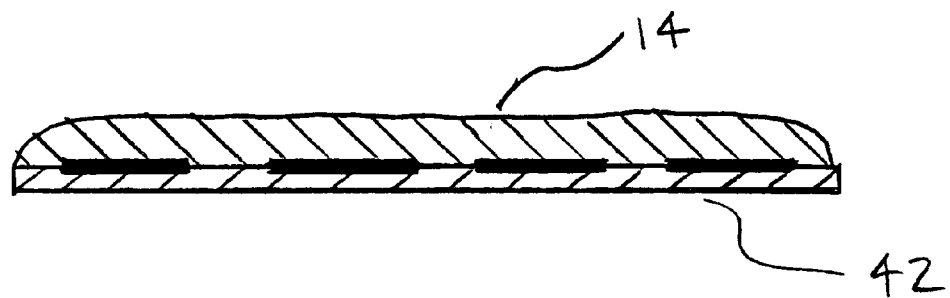
FIG. 3B shows a schematic cross-section view of a third example, according to the present invention, after covering the top of the wafer, including the sensitive areas, with an electrically insulating coating.

FIG. 3B shows a schematic cross-section view of a third example, according to the present invention, that is similar to FIG. 3A, after covering the top of wafer 42, including the sensitive area 12, with an electrically insulating coating 14 (e.g. glob-top polymer, epoxy resin, parylene, silicon dioxide). Alternatively, the entire silicon wafer 42 could be encapsulated in a plastic body (not shown).

Figure 3C:
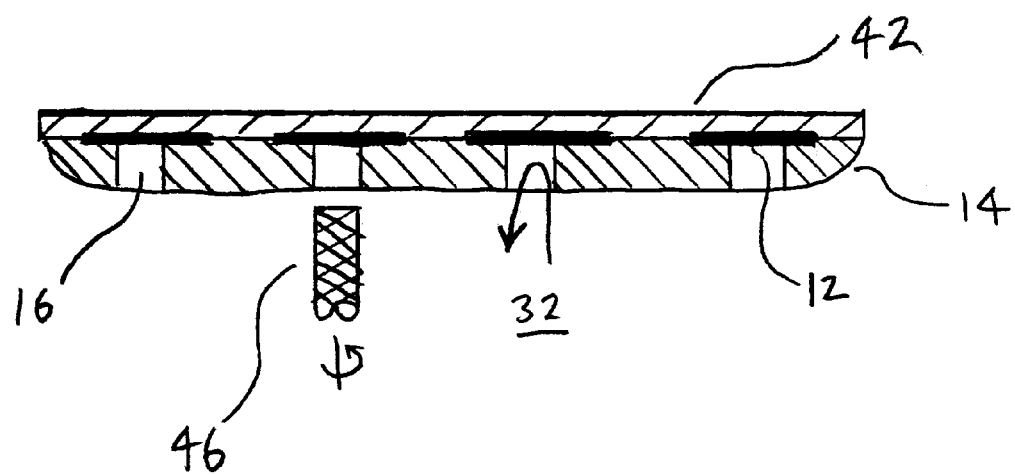
FIG. 3C shows a schematic cross-section view of a third example, according to the present invention, where the insulating coating can be perforated by two different methods, mechanical milling, and acid etching, thereby exposing the sensitive areas to the surrounding environment.

FIG. 3C shows a schematic cross-section view of a third example, according to the present invention, that is similar to FIG. 3B, where the insulating coating 14 can be perforated by two different methods, mechanical milling 46, and acid etching 32, thereby exposing the sensitive areas to the surrounding environment through perforation 16.

Figure 4A:
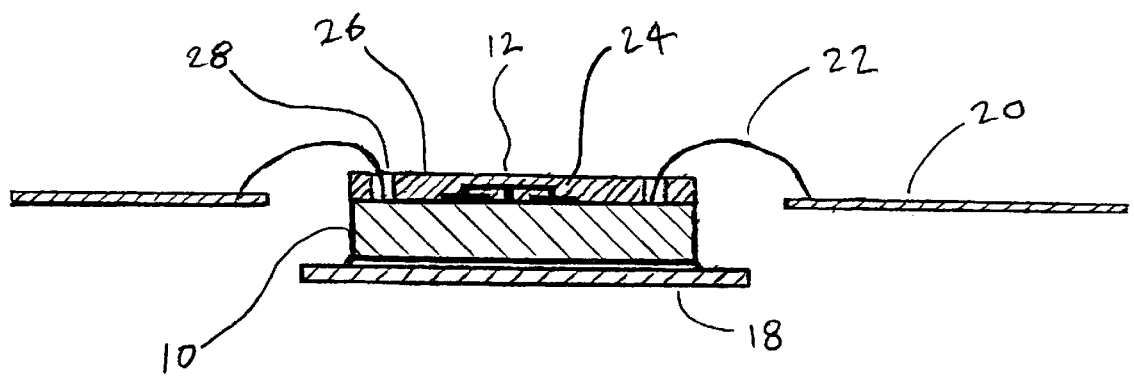
FIG. 4A shows a schematic cross-section view of a fourth example, according to the present invention, of an unreleased MEMS device attached to a lead frame paddle, and wirebonded to the lead frame.

FIG. 4A shows a schematic cross-section view of a fourth example, according to the present invention, of an unreleased MEMS device 10 attached to a paddle 18 of a lead frame 20, and wirebonded 22 to the lead frame 20. Device 10 can include unreleased MEMS elements 24 that can be surrounded by a sacrificial protective layer 26, which can be made of silicon dioxide, silicate glass, or vapor-deposited polymer (e.g. parylene). Wirebonds 22 can be attached to bond pads (not shown) on the surface of device 10. These bond pads have been exposed by cutting vias 28 through protective layer 26 with a laser or other tool, as is well-known in the art. In this example, sensitive area 12 can include MEMS elements 24.

Figure 4B:
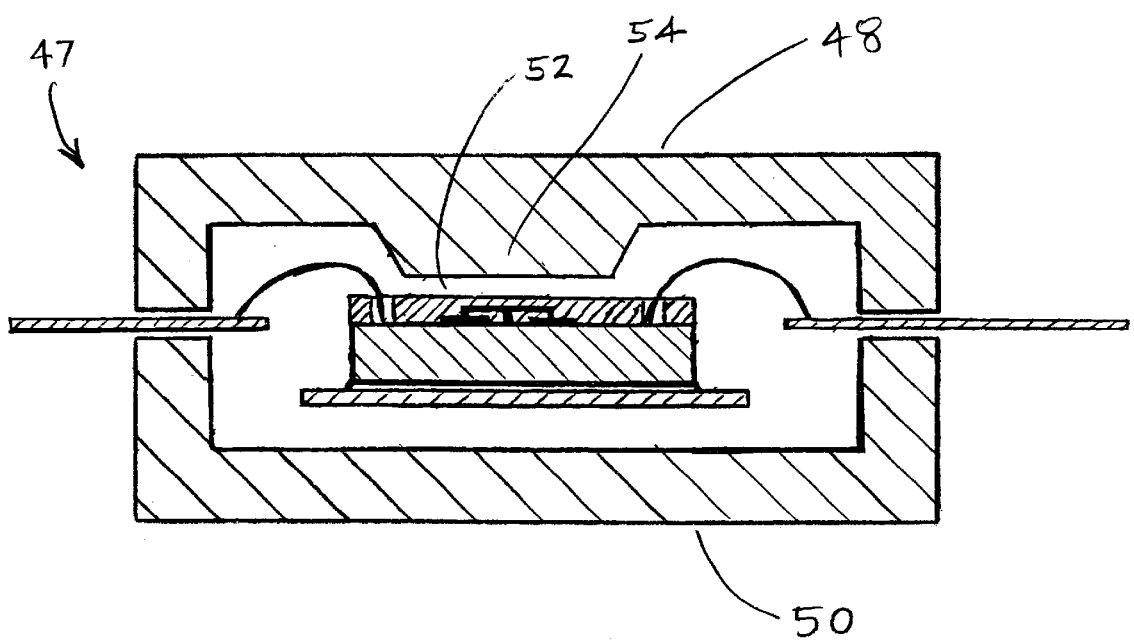
FIG. 4B shows a schematic cross-section view of a fourth example, according to the present invention, of an unreleased MEMS device attached to a lead frame paddle, and wirebonded to the lead frame, placed inside a two-piece mold assembly, where the upper part of the mold assembly has an integral, inwardly extending protrusion that does not touch the top of the MEMS device.

FIG. 4B shows a schematic cross-section view of a fourth example, according to the present invention, that is similar to FIG. 4A, where device 10 has been placed inside of a two-piece mold assembly 47, wherein assembly 47 includes a lower part 50 and an upper part 48, wherein the upper part 48 has an integral, inwardly extending protrusion 54 that does not touch the top surface of the MEMS device 10. This creates a positive gap 52 in-between the top surface of the MEMS device 10 and the bottom surface of protrusion 54 for plastic encapsulant 14 to flow into. One reason for using protrusion 54 is to reduce the thickness of encapsulant that has to be removed during the perforation step, thereby reducing the time and cost required to complete that step.

Figure 4C:
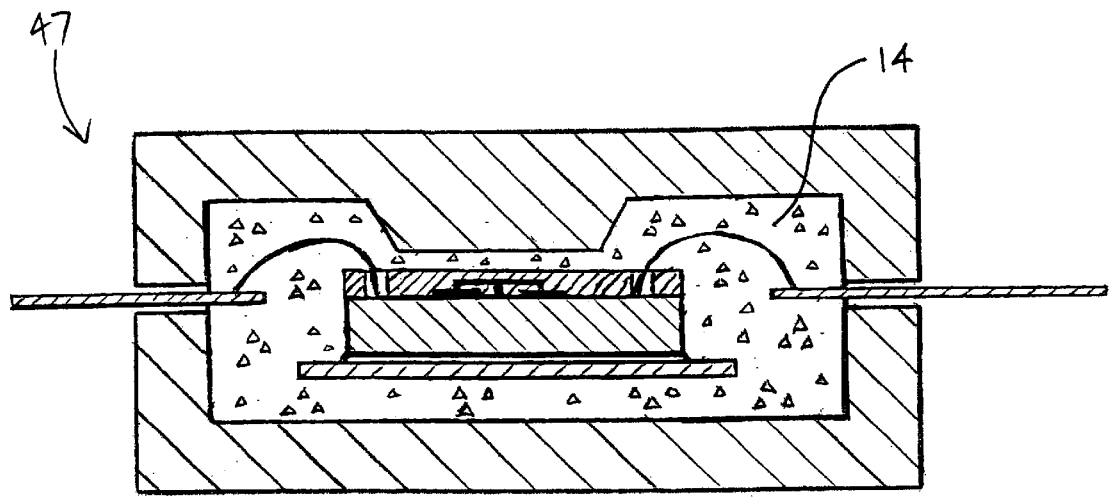
FIG. 4C shows a schematic cross-section view of a fourth example, according to the present invention, of an unreleased MEMS device attached to a lead frame paddle, and wirebonded to the lead frame, placed inside a two-piece mold assembly, after being transfer molded and encapsulated with a plastic encapsulant.

FIG. 4C shows a schematic cross-section view of a fourth example, according to the present invention, that is similar to FIG. 4B, after being transfer molded in a two-piece mold assembly 47, and encapsulated with a flowable plastic encapsulant 14. Many possible "Plastic" compounds can be used, including: epoxy, resin, plastics, glob top polymers, gels, silicones, rubber, thermosetting plastics, thermoplastic plastics, two-part epoxies, UV curable epoxies, fast curing epoxies, slow curing epoxies, water-soluble compounds, water-insoluble compounds, NOVOLAC epoxies, anhydride epoxy, polyimide epoxy, polyphenylene sulfide polymers, polyetherimide polymers, polyethersulfone polymers, liquid crystal polymers, urethanes, polyesters, transparent, opaque, and hardenable resins. One purpose of the encapsulating step is to provide structural support for the electrical leads, and to ruggedize the microelectronic device against breakage, contamination, abuse, electrostatic effects, moisture, light, and associated handling stresses.

Figure 4D:
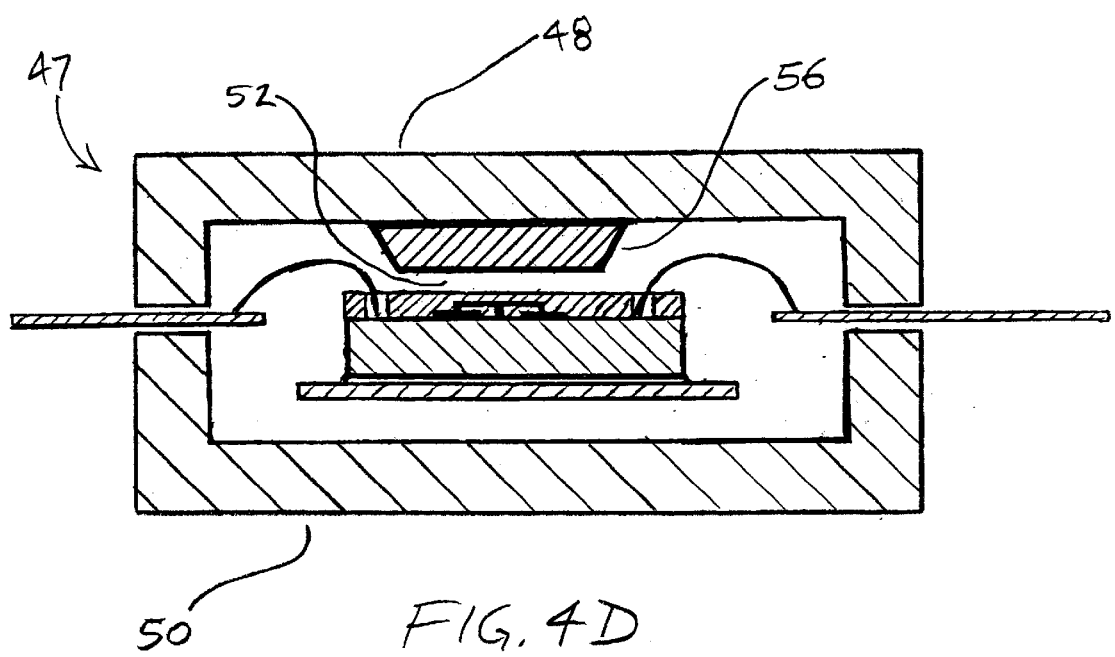
FIG. 4D shows a schematic cross-section view of a fourth example, according to the present invention, of an unreleased MEMS device attached to a lead frame paddle, and wirebonded to the lead frame, placed inside an alternative two-piece mold assembly, where the upper part of the mold assembly has an attached separate mold insert member that that does not touch the top of the MEMS device.

FIG. 4D shows a schematic cross-section view of a fourth example, according to the present invention, that is similar to FIG. 4A, where the mold assembly 47 can have a separate mold insert member 56 attached to the inside surface of the upper part 48. The lower surface of mold insert member 56 does not touch the top surface of the MEMS device 10, thereby creating a positive gap 52 for plastic encapsulant 14 to flow into.

Figure 4E:
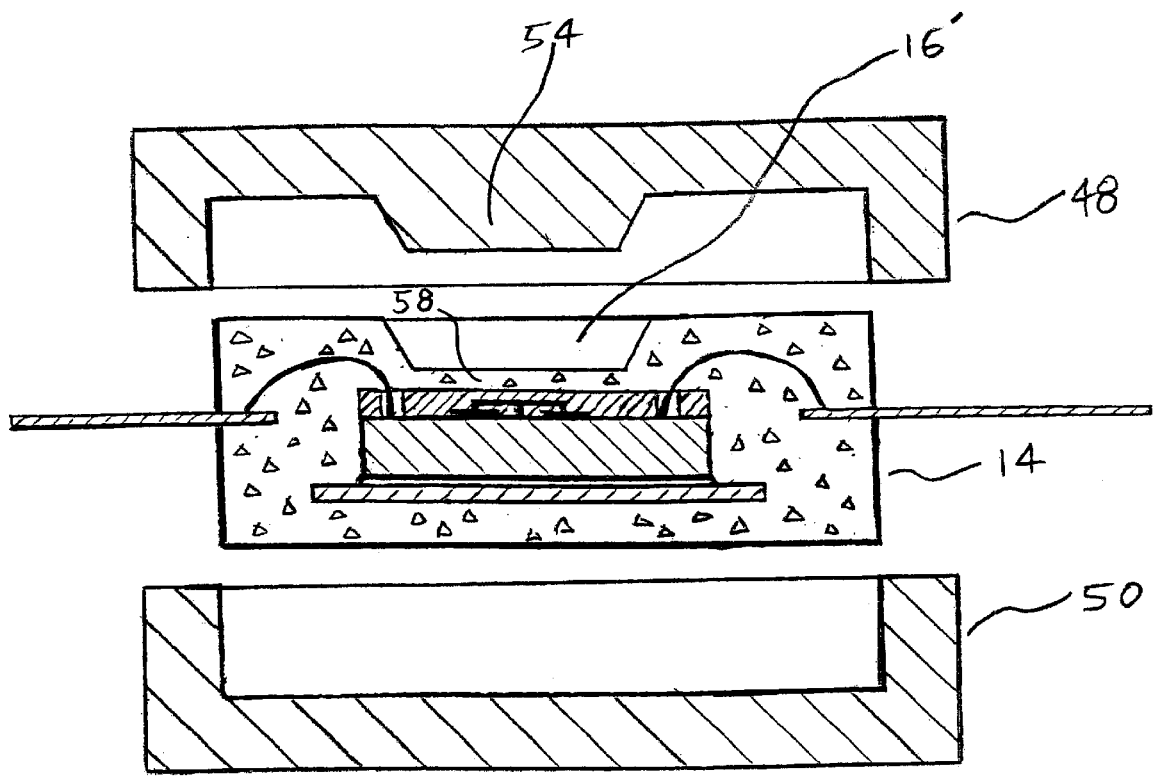
FIG. 4E shows a schematic cross-section view of a fourth example, according to the present invention, of an unreleased MEMS device attached to a lead frame paddle, and wirebonded to the lead frame, being removed from the two-piece mold assembly, after the plastic encapsulant has cured and hardened, showing a locally thinner region of plastic directly above the unreleased MEMS elements.

FIG. 4E shows a schematic cross-section view of a fourth example, according to the present invention, that is similar to FIG. 4D, after the plastic encapsulant has cured and hardened, wherein a thin layer of plastic 58 has flowed and filled-in gap 52. Removal of the upper mold part 48 reveals a region of partial perforation 16' created by inwardly extending integral protrusion 54.

Figure 4F:
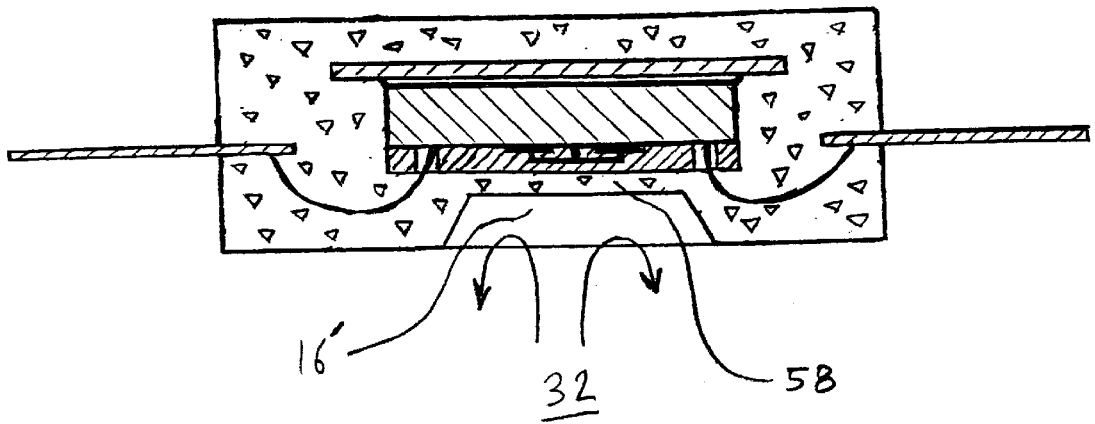
FIG. 4F shows a schematic cross-section view of a fourth example, according to the present invention, of an unreleased MEMS device attached to a lead frame paddle, and wirebonded to the lead frame, encapsulated in a plastic package, where the thinner region of plastic above the unreleased MEMS elements can be removed by a first acid etching process.

FIG. 4F shows a schematic cross-section view of a fourth example, according to the present invention, that is similar to FIG. 4E, where the thin layer of plastic 58 can be removed by using a first acid etching process 32 (as described earlier), accessed through partial perforation 16'.

Figure 4G:
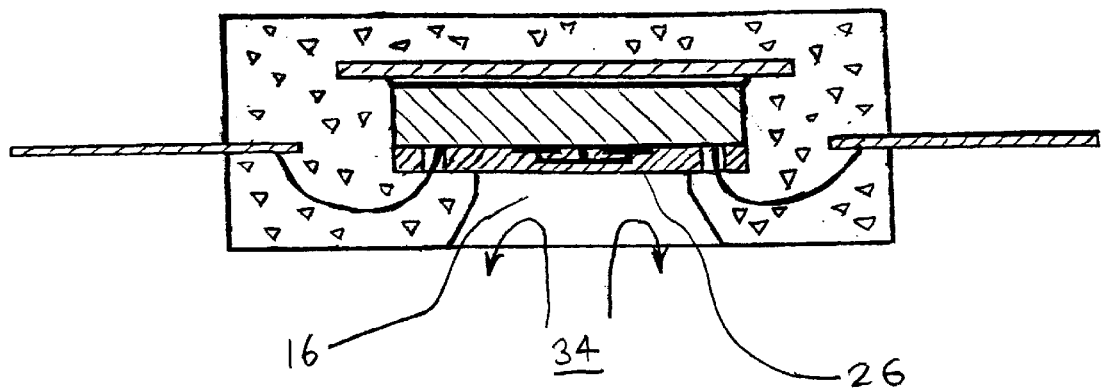
FIG. 4G shows a schematic cross-section view of a fourth example, according to the present invention, of an unreleased MEMS device attached to a lead frame paddle, and wirebonded to the lead frame, encapsulated in a plastic package, where the perforation has been completed, and the sacrificial layer surrounding the MEMS elements can be removed by a second acid etching process.

FIG. 4G shows a schematic cross-section view of a fourth example, according to the present invention, that is similar to FIG. 4F, where perforation 16 has been completely opened, and the sacrificial layer 26 surrounding the MEMS elements 24 can be removed (e.g. released) by using a second acid etching process 34 (as described earlier).

Figure 4H:
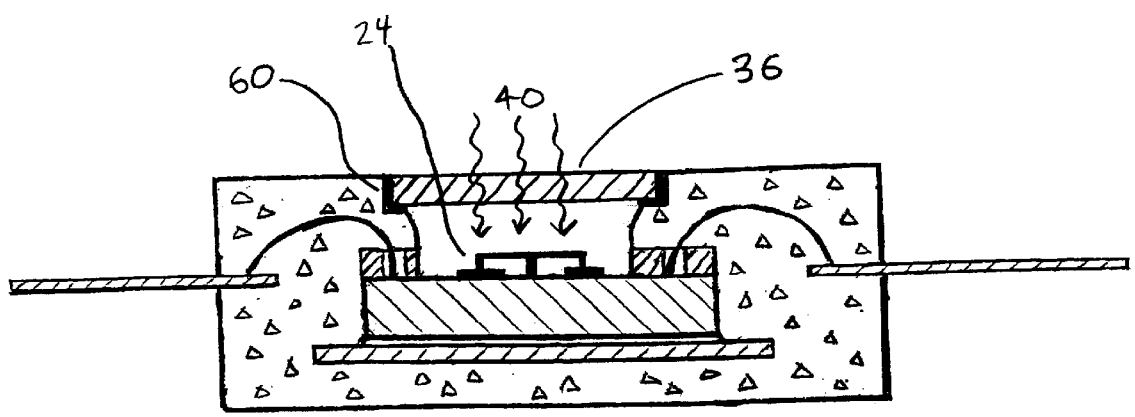
FIG. 4H shows a schematic cross-section view of a fourth example, according to the present invention, of a released MEMS device attached to a lead frame paddle, and wirebonded to the lead frame, encapsulated in a plastic package, where an open cavity has been created above the released MEMS elements, and where a window has been attached to a recessed lip in the plastic package, for providing optical access to the MEMS device.

FIG. 4H shows a schematic cross-section view of a fourth example, according to the present invention, that is similar to FIG. 4G, where an open cavity has been created above the released MEMS elements 24, and where a window 36 has been attached to a recessed lip 60 in the plastic package, for providing optical access 40 to the MEMS device. Recessed lip 60 can be formed by machining package 14 after the plastic has cured and hardened. Alternatively, lip 60 can be formed during transfer molding by using an appropriately shaped ledge (not shown) located on protrusion 54, or located on mold insert member 56.

Figure 5A:
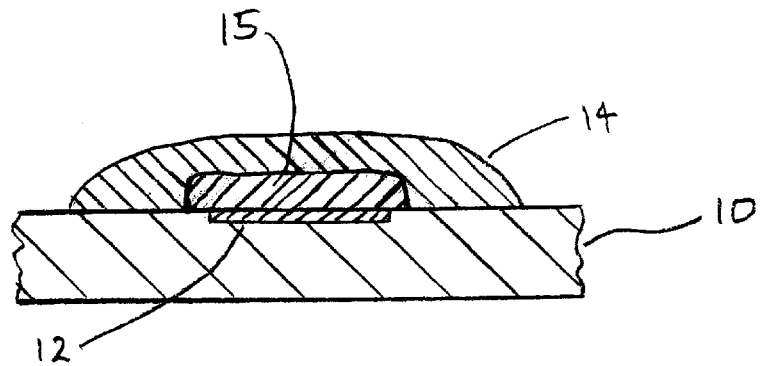
FIG. 5A shows a schematic cross-section view of. a fifth example, according to the present invention, of a microelectronic device having an sensitive area covered by a temporary protective material, wherein the temporary protective material is substantially encased in an electrically insulating material.

FIG. 5A shows a schematic cross-section view of a fifth example, according to the present invention, of a microelectronic device 10 having an sensitive area 12 covered by a temporary protective material 15, wherein the temporary protective material is encased in an electrically insulating material 14. Temporary protective material 15 is not the same material as insulating material 14.

The temporary protective material can include a parylene polymer. The parylene coating can be poly-para-xylylene, poly-para-xylylene which has been modified by the substitution of a chlorine atom for one of the aromatic hydrogens, or poly-para-xylylene which has been modified by the substitution of the chlorine atom for two of the aromatic hydrogens. The method can include blending the parylene polymer with a reactive material to form a copolymer coating. The reactive material can include a monomer containing silicon, carbon, or fluorine, or a combination thereof. The temporary protective material can include silicon nitride, metal (e.g. aluminum or tungsten), a vapor deposited organic material, cynoacrylate, a carbon film, a self-assembled monolayered material, perfluoropolyether, hexamethyidisilazane, or perfluorodecanoic carboxylic acid, silicon dioxide, silicate glass, or combinations thereof.

FIG. 5A also shows an alternative method comprising the steps of providing a microelectronic device 10 having a sensitive area 12; covering at least the sensitive area 12 in a temporary protective material 15; substantially encasing the temporary protective material with an electrically insulating material 14 that is different than the temporary protective material 15; and substantially hardening the electrically insulating material 14 before perforating the electrically insulating material.

The encasing step in FIG. 5A can comprise encapsulating the device in the electrically insulating material 14. The encasing step can comprise using a process selected from pouring, casting, spin-on coating, and glob top overmolding. The temporary protective material 15 can comprise a flowable elastomeric material selected from rubber, silicone, and polyurethane. The step of removing the temporary protective material 15 can comprise picking the material out by hand or by a robot manipulator. The temporary protective material 15 can comprise a dissolvable material that is dissolvable with a solvent that also does not substantially dissolve the electrically insulating material. The temporary protective material 15 can comprise a low-melting point material (e.g. wax, solder), which can be melted and flowed out of opening 13.

The electrically insulating material 14 in FIG. 5A can comprise a flowable plastic material (e.g. epoxy resin) that is etchable by nitric acid or fuming nitric acid but is not etchable by sulfuric acid or fuming sulfuric acid. In this example, temporary protective material 15 can comprise a glob top polymer.

Alternatively, the electrically insulating material 14 can comprise a flowable plastic material (e.g. glob top polymer) that is etchable by sulfuric acid or fuming sulfuric acid but is not etchable by nitric acid or fuming nitric acid. In this example, temporary protective material 15 can comprise an epoxy resin.

Figure 5B:
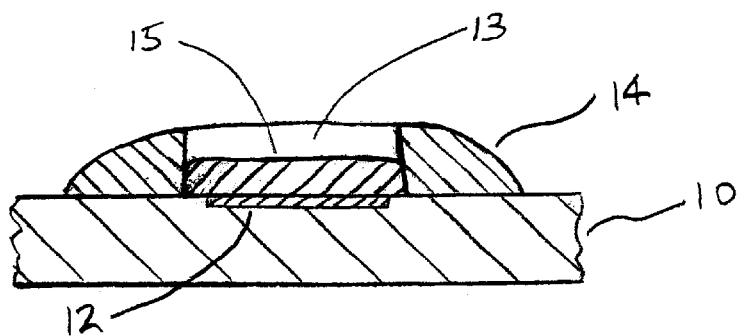
FIG. 5B shows a schematic cross-section view of a fifth example, according to the present invention, of a microelectronic device having an sensitive area covered by a temporary protective material, wherein the electrically insulating material has been perforated to provide access to the temporary protective material.

FIG. 5B shows a schematic cross-section view of a fifth example, according to the present invention, that is similar to FIG. 5A, wherein the electrically insulating material 14 has been perforated to provide access to the temporary protective material 15 through opening 13.

Figure 5C:
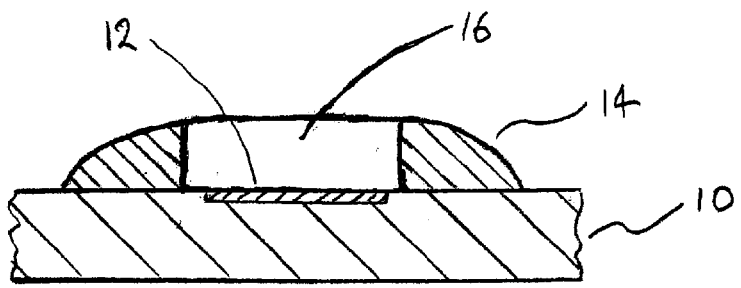
FIG. 5C shows a schematic cross-section view of a fifth example, according to the present invention, of a microelectronic device having an sensitive area covered by a temporary protective material, wherein the temporary protective material has been removed, thereby exposing the sensitive area to the surrounding environment.

FIG. 5C shows a schematic cross-section view of a fifth example, according to the present invention, that is similar to FIG. 5B, wherein the temporary protective material 15 has been removed, thereby activating the sensitive area 12 by exposing it to the surrounding environment through perforation 16.

Figure 6A:
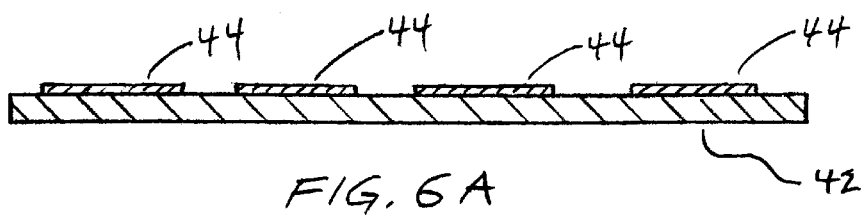
FIG. 6A shows a schematic cross-section view of a sixth example, according to the present invention, of a plurality of IC's or MEMS devices disposed on a wafer.

FIG. 6A shows a schematic cross-section view of a sixth example, according to the present invention, of a plurality of IC's or MEMS devices 44 disposed on wafer 42, with each of the devices 44 having a sensitive area 12.

Figure 6B:
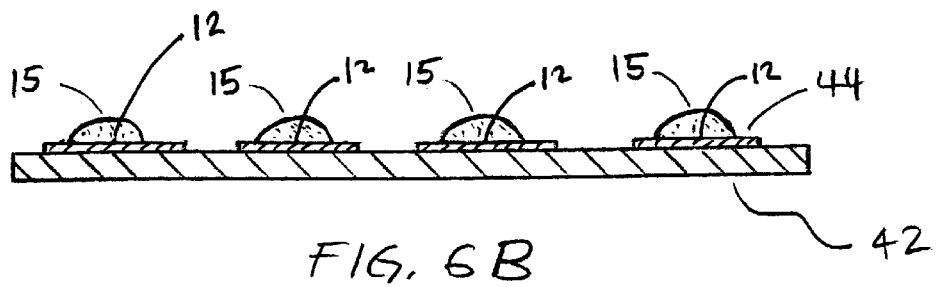
FIG. 6B shows a schematic cross-section view of a sixth example, according to the present invention, of a plurality of IC's or MEMS devices disposed on a wafer, each having an sensitive area covered by a temporary protective material.

FIG. 6B shows a schematic cross-section view of a sixth example, according to the present invention, that is similar to FIG. 6A, wherein each sensitive area 12 is covered by a temporary protective material 15.

Figure 6C:
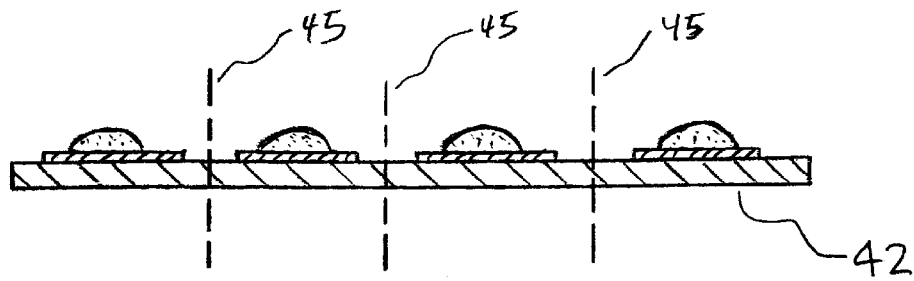
FIG. 6C shows a schematic cross-section view. of a sixth example, according to the present invention, wherein the wafer is being cut into multiple individual device dies.

FIG. 6C shows a schematic cross-section view of a sixth example, according to the present invention, that is similar to FIG. 6B, wherein wafer 42 is being cut into multiple individual device dies 10 in a manner well-known to those skilled in the art.

Figure 6D:
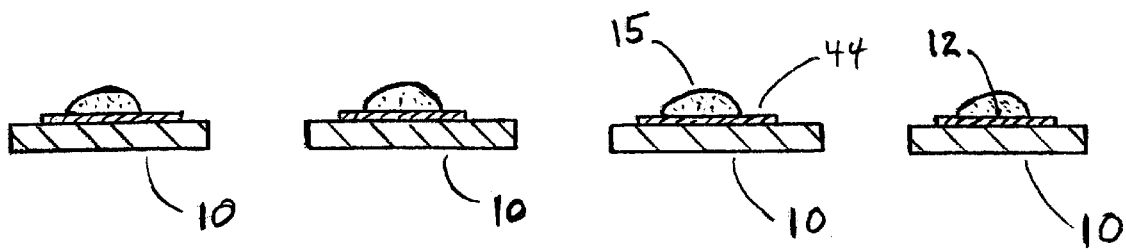
FIG. 6D shows a schematic cross-section view of a sixth example, according to the present invention, of individual IC's or MEMS device dies, each having an sensitive area covered by a temporary protective material.

FIG. 6D shows a schematic cross-section view of a sixth example, according to the present invention, that is similar to FIG. 6C, of four individual IC's or MEMS device dies 10, each having an sensitive area 12 covered by a temporary protective material 15.

Figure 6E:
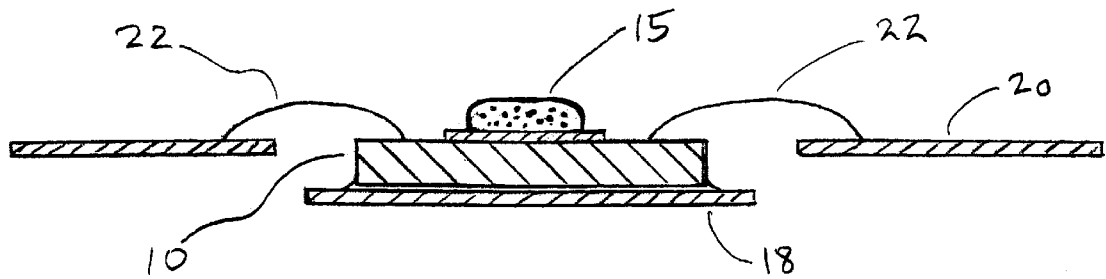
FIG. 6E shows a schematic cross-section view of a sixth example, according to the present invention, of a microelectronic device die having an sensitive area covered by a temporary protective material, where the die is attached to a lead frame paddle, and wirebonded to the lead frame.

FIG. 6E shows a schematic cross-section view of a sixth example, according to the present invention, that is similar to FIG. 6D, where the die 10 has been attached to a paddle 18, and wirebonded to the lead frame 20 with wirebonds 22.

Figure 6F:
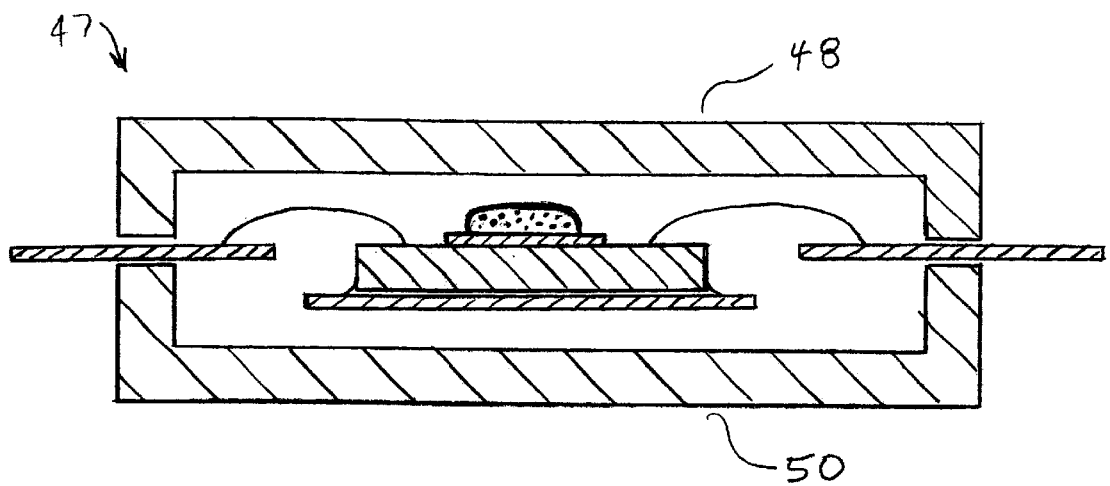
FIG. 6F shows a schematic cross-section view of a sixth example, according to the present invention, of a microelectronic device die attached to a lead frame paddle, and wirebonded to the lead frame, placed inside a two-piece transfer mold assembly.

FIG. 6F shows a schematic cross-section view of a sixth example, according to the present invention, that is similar to FIG. 6E, of a microelectronic device 10 placed inside a two-piece transfer mold assembly 47 made of upper frame 48 and lower frame 50. The top of temporary protective material 15 does not touch the inside surface of upper frame 48, so that temporary protective material 15 can be substantially encased in insulating material 15 in the next step.

Figure 6G:
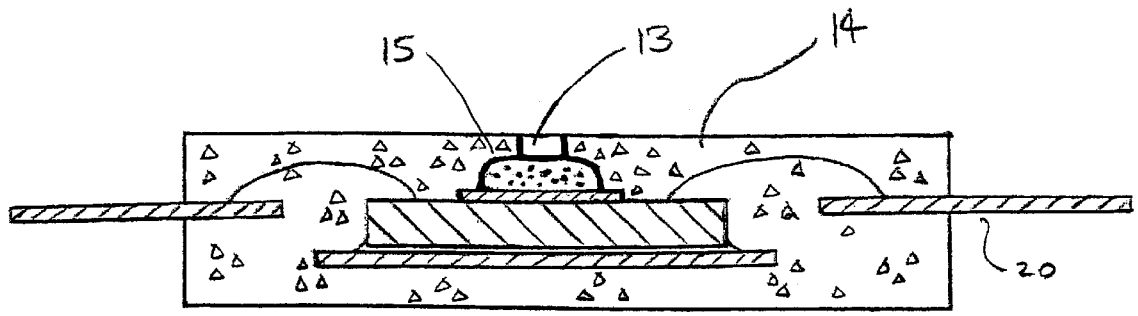
FIG. 6G shows a schematic cross-section view of a sixth example, according to the present invention, of a microelectronic device attached to a lead frame paddle, and wirebonded to the lead frame, after being encapsulated in plastic, and after being perforated to provide access to the temporary protective material.

FIG. 6G shows a schematic cross-section view of a sixth example, according to the present invention, that is similar to FIG. 6F, after being encapsulated in plastic 14, and after being perforated to provide access to the temporary protective material 15 through opening 13. In this example, the width of opening 13 is smaller than the width of temporary protective material 15.

Figure 6H:
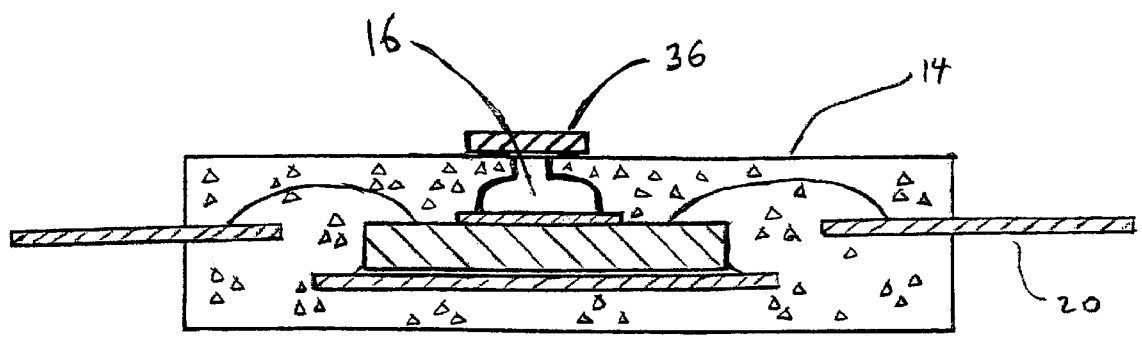
FIG. 6H shows a schematic cross-section view of a sixth example, according to the present invention, of a microelectronic device attached to a lead frame paddle, and wirebonded to the lead frame, encapsulated in plastic, after the temporary protective material has been removed, also with a window attached across the perforation.

FIG. 6H shows a schematic cross-section view of a sixth example, according to the present invention, that is similar to FIG. 6G, after the temporary protective material 15 has been removed by wet acid etching. Also, a window 36 has been attached across the perforation 16. In this example, the width of window 36 is smaller than the width of the package 14.

Figure 7A:
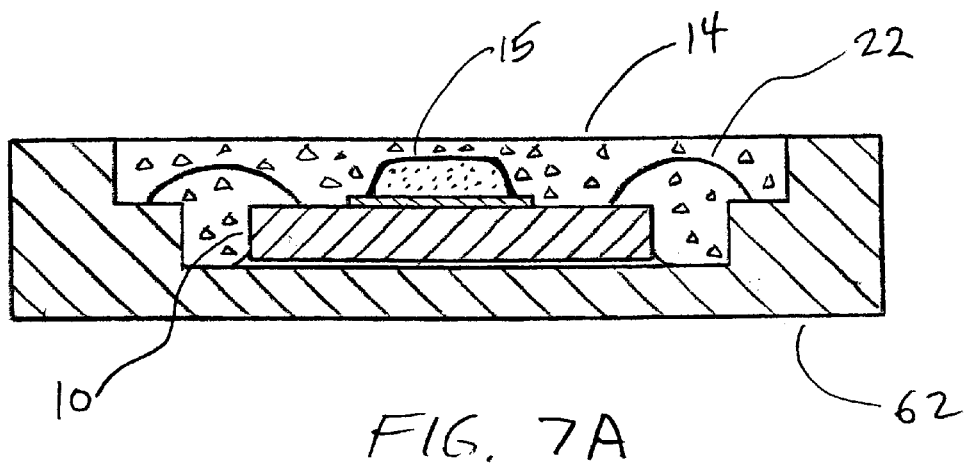
FIG. 7A shows a schematic cross-section view of a seventh example, according to the present invention, of a microelectronic device die attached and wirebonded to a package, and encased in plastic.

FIG. 7A shows a schematic cross-section view of a seventh example, according to the present invention, of a microelectronic device die 10, having an sensitive area 12 covered by a temporary protective material 15, wherein the device die 10 has been attached and wirebonded to package 62, and then flowable plastic has been poured into package 62, thereby surrounding and encasing device die 10, wirebonds 22, and temporary material 15 in an electrically insulating material 14. Package 62 can comprise a low-temperature or high-temperature cofired ceramic multilayered body with metallized conductive traces interconnecting wirebonds 22 to external bonding pads (not shown). Alternatively, package 62 can comprise a multilayered polymer printed wiring board material and construction.

Figure 7B:
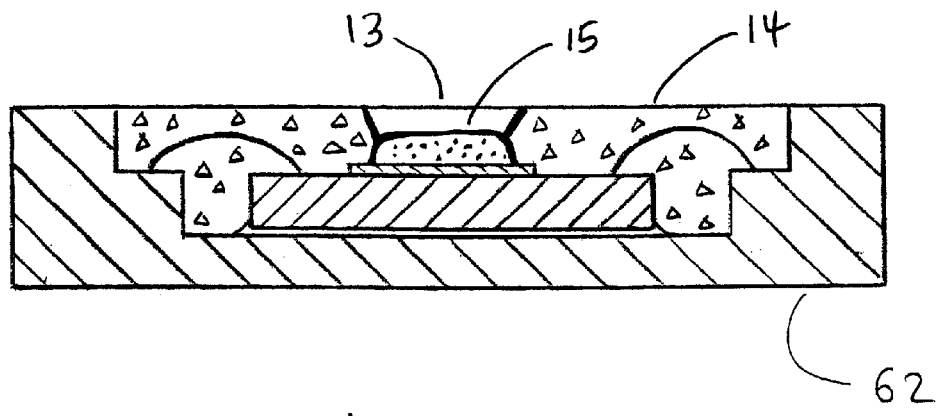
FIG. 7B shows a schematic cross-section view of a seventh example, according to the present invention, of a microelectronic device die attached and wirebonded to a package, and encased in plastic; after being perforated to provide access to the temporary protective material.

FIG. 7B shows a schematic cross-section view of a seventh example, according to the present invention, that is similar to FIG. 7A, after material 14 has been perforated to provide access to the temporary protective material 15 through opening 13.

Figure 7C:
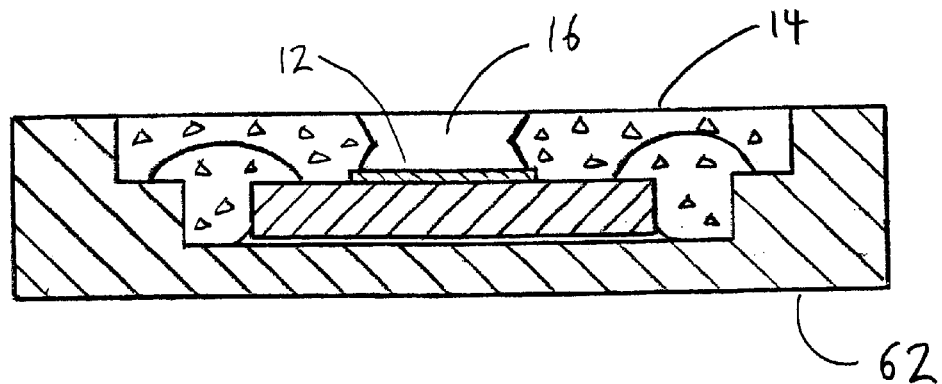
FIG. 7C shows a schematic cross-section view of a seventh example, according to the present invention, of a microelectronic device die attached and wirebonded to a package, and encased in plastic; after the temporary protective material has been removed, thereby proving free access to the sensitive area through the perforation.

FIG. 7C shows a schematic cross-section view of a seventh example, according to the present invention, that is similar to FIG. 7B, after the temporary protective material 15 has been removed, thereby proving free access to the sensitive area 12 through the perforation 16.

The particular examples discussed above are cited to illustrate particular embodiments of the invention. Other applications and embodiments of the apparatus and method of the present invention will become evident to those skilled in the art. For example, although the figures illustrate only a single MEMS device, the method described herein applies equally well to packaging of multiple MEMS or IMEMS devices. Also, the method of perforating one side of a plastic package can be applied to an opposite side. One example of this can be perforating both sides of a pressure-sensitive area on a microsensor device that is encapsulated in plastic. By perforating both sides, then a pressure differential can be sensed from one side of the device to the other side. The actual scope of the invention is defined by the claims appended hereto.

We claim:

1. A method for activating at least one sensitive area of a microelectronic device, comprising:

providing a microelectronic device comprising a sensitive area disposed on a substrate, wherein the sensitive area comprises an inner surface facing towards the substrate and an outer surface facing away from the substrate; and wherein the microelectronic device further comprises a layer of electrically insulating material disposed on and touching said outer surface of the sensitive area, wherein the outer surface of the sensitive area is covered and protected by the electrically insulating material; and then perforating a sufficient amount of the layer of electrically insulating material to expose at least part of the outer surface of the sensitive area to the surrounding environment by using a non-ablative material removal process to selectively remove some, but not all, of the layer of electrically insulating material; whereby said at least part of the outer surface of the sensitive area becomes activated by exposing said at least part of the outer surface of the sensitive area to the surrounding environment.

2. The method of claim 1, wherein the non-ablative material removal process comprises a process selected from wet etching, dry etching, water jet cutting, mechanical machining, and ultrasonic machining, or a combination thereof.

3. The method of claim 2, wherein the wet etching step comprises directing a stream of etching fluid in a direction substantially perpendicular to the sensitive area.

4. The method of claim 3, wherein the step of directing a stream of etching fluid comprises operating a commercially available decapsulator.

5. The method of claim 4, wherein operating the decapsulator comprises using a gasket located in-between the microelectronic device and the nozzle of the decapsulator, whereby etching fluid and contaminants are substantially contained.

6. The method of claim 2, wherein the non-ablative material removal process comprises dry etching, and further wherein the dry etching step comprises using a process selected from plasma etching, reactive ion etching, and ion milling.

7. The method of claim 6, wherein the active ion comprises oxygen, chlorine, or fluorine, or any combination thereof.

8. The method of claim 1, wherein the electrically insulating material comprises plastic or glass.

9. The method of claim 8, wherein the electrically insulating material comprises a plastic material, and further wherein the non-ablative material removal process comprises wet etching the plastic material with an etching fluid comprising nitric acid, sulfuric acid, or any combination thereof.

10. The method of claim 9, wherein the etching fluid comprises a heated acid solution selected from fuming nitric acid at about 80–100 C, fuming sulfuric acid at about 230–260 C, and non-fuming sulfuric acid at about 230–260 C.

11. The method of claim 8, wherein the electrically insulating material comprises a glass material, and further wherein the non-ablative material removal process comprises wet etching the glass material with an etching fluid comprising hydrochloric acid, hydrofluoric acid, or any combination thereof.

12. The method of claim 1, wherein the perforating step comprises holding the microelectronic device upside down during the perforating process, whereby unwanted materials fall down and away from the sensitive area.

13. The method of claim 1, wherein the non-ablative material removal process comprises first removing a majority of the insulating material using a fast removal process, followed by removing the remaining insulating material using a slow removal process.

14. The method of claim 13, wherein the fast removal process comprises using a process selected from mechanical machining, water jet cutting, ultrasonic machining, and wet etching using a high velocity stream of etching fluid.

15. The method of claim 13, wherein the slow removal process comprises using a process selected from dry etching, and wet etching with a low velocity stream of etching fluid.

16. The method of claim 1, wherein the microelectronic device comprises an unreleased MEMS element located within the sensitive area.

17. The method of claim 16, further comprising releasing the unreleased MEMS element, after completing the perforating step.

18. The method of claim 17, wherein the unreleased MEMS element comprises a protective coating comprising silicon dioxide or silicate glass.

19. The method of claim 18, wherein the releasing step comprises using a wet etching process that further comprises using an etching fluid comprising hydrochloric acid, hydrofluoric acid, or any combination thereof.

20. The method of claim 17, wherein the unreleased MEMS element comprises a protective coating comprising parylene.

21. The method of claim 20, wherein the releasing step comprises a dry plasma etching process.

22. The method of claim 17, further comprising the step of applying an anti-stiction coating to the released MEMS element, after completing the release step.

23. The method of claim 17, further comprising the step of attaching a window across the perforation, after completing the releasing step.

24. The method of claim 1, wherein the sensitive area comprises an opticallyactive area.

25. The method of claim 1, wherein the sensitive area comprises a chemically-sensitive area.

26. The method of claim 1, wherein the sensitive area comprises a pressure-sensitive area.

27. The method of claim 26, further comprising the step of repeating the steps recited in claim 1, but now applied to the opposite side of the pressure-sensitive area, thereby providing free access to both sides of the pressure-sensitive area.

28. The method of claim 1, wherein the sensitive area comprises a temperature-sensitive area.

29. The method of claim 1, further comprising the step of attaching a cover lid to the insulating material, disposed across the perforation, for covering and protecting the sensitive area.

30. The method of claim 29, wherein the cover lid comprises a window attached to the cover lid, for providing optical access to the sensitive area.

31. The method of claim 29, wherein the cover lid is attached flush within the perforation.

32. The method of claim 29, wherein the cover lid is attached flush within a recessed lip disposed inside of the perforation.

33. The method of claim 1, wherein the microelectronic device comprises a wafer comprising a plurality of semiconductor elements or MEMS elements.

34. The method of claim 33, wherein the insulating material comprises a photoresist material.

35. The method of claim 33, wherein the insulating material comprises silicon dioxide or a silicate glass.

36. The method of claim 33, wherein the insulating material comprises parylene.

37. The method of claim 1, wherein the providing step comprises:

providing a microelectronic device comprising a sensitive area disposed on a substrate, wherein the sensitive area comprises an inner surface facing towards the substrate and an outer surface facing away from the substrate; and then depositing a layer of electrically insulating material on and touching said outer surface of the sensitive area, wherein the outer surface of the sensitive area becomes covered and protected by the layer of electrically insulating material.

38. The method of claim 37, wherein the insulating material comprises a flowable dielectric compound selected from epoxy resin, silicone, rubber, thermosetting plastic, thermoplastic plastic, two-part epoxy, UV-curable epoxy, anhydride epoxy, polyimide epoxy, polyphenylene sulfide polymer, polyetherimide polymer, polyethersulfone polymer, liquid crystal polymer, urethane, and polyester resin.

39. The method of claim 37, wherein the insulating material comprises glass.

40. The method of claim 37, wherein the covering step comprises using a process selected from pouring, casting, spin-on coating, and glob top molding.

41. The method of claim 37, wherein the covering step comprises encapsulating the device in the electrically insulating material.

42. The method of claim 41, wherein the microelectronic device comprises an unreleased MEMS device wirebonded to a lead frame, and further comprising a MEMS element located within the sensitive area.

43. The method of claim 41, further comprising releasing the unreleased MEMS element, after completing the perforation step.

44. The method of claim 41, wherein the microelectronic device comprises an unreleased MEMS device flip-chip mounted to a lead frame; and further comprising a MEMS element located within the sensitive area.

45. The method of claim 41, wherein the encapsulating step comprises transfer molding with at least a two-piece mold having an upper mold part and a lower mold part.

46. The method of claim 45, wherein the transfer molding step further comprises using exclusionary means located inside of the closed mold to prevent the insulating material from flowing into a volume positioned above, but not touching, the sensitive area; whereby a substantially empty void is created inside of the volume after removing the exclusionary means and the device from the mold; and further wherein the exclusionary means allows some insulating material to flow across the sensitive area during the transfer molding step, thereby creating a locally thinner region of encapsulant directly above, and in contact with, the sensitive area.

47. The method of claim 46, wherein the exclusionary means comprises an inwardly extending integral protrusion belonging to the upper mold part, which extends towards the surface of the sensitive area, but does not touch it.

48. The method of claim 46, wherein the exclusionary means comprises a separate mold insert member removeably attached to the inside surface of the upper mold part, which extends towards the surface of the sensitive area, but does not touch it.

49. The method of claim 37, wherein the electrically insulating material comprises a flowable dielectric compound selected from the group consisting of a resin, a plastic, a glob-top polymer, a gel, a fast curing epoxy, a slow curing epoxy, a water-soluble compound, a NOVOLAC™ epoxy, a hardenable resin, and a transparent resin.

50. The method of claim 1, wherein the electrically insulating material comprises a water-soluble material, and further wherein the non-ablative material removal process comprises using water as an etching fluid.

51. A method for activating at least one sensitive area of a microelectronic device, comprising:
   providing a microelectronic device having a sensitive area covered by a temporary protective material; wherein the temporary protective material is substantially encased in an electrically insulating material that is different than the temporary protective material;
   perforating the electrically insulating material to provide access to the temporary protective material; and
   removing the temporary protective material by using a non-ablative material removal process;
   whereby the sensitive area becomes activated by being exposed to the surrounding environment.

52. The method of claim 51, further comprising:
   providing a microelectronic device having a sensitive area;
   covering at least the sensitive area in a temporary protective material;
   substantially encasing the temporary protective material with an electrically insulating material that is different than the temporary protective material; and
   substantially hardening the electrically insulating material before perforating the electrically insulating material.

53. The method of claim 52, wherein the encasing step comprises encapsulating the device in the electrically insulating material.

54. The method of claim 52, wherein the encasing step comprises using a process selected from pouring, casting, spin-on coating, and glob top overmolding.

55. The method of claim 52, wherein the microelectronic device comprises a wafer having a plurality of sensitive areas disposed thereon; and further wherein the covering step comprises covering the plurality of sensitive areas; and further comprising a step of cutting the wafer into individual device dies before performing the encasing step.

56. The method of claim 51, wherein the temporary protective material comprises a flowable elastomeric material selected from rubber, silicone, and polyurethane.

57. The method of claim 56, wherein the step of removing the temporary protective material comprises picking the material out by hand or by a robot manipulator.

58. The method of claim 51, wherein the temporary protective material comprises a dissolvable material.

59. The method of claim 58, wherein the step of removing the temporary protective material comprises dissolving the material with a solvent that does not substantially dissolve the electrically insulating material.

60. The method of claim 51, wherein the temporary protective material comprises a low-melting point material.

61. The method of claim 60, wherein the step of removing the temporary protective material comprises melting the material and letting it flow out.

62. The method of claim 60, wherein the low-melting point material is a material selected from the group consisting of wax and solder.

63. The method of claim 51, wherein the electrically insulating material comprises a flowable plastic material that is etchable by nitric acid or fuming nitric acid but is not etchable by sulfuric acid or fuming sulfuric acid.

64. The method of claim 63, wherein the electrically insulating material comprises an epoxy resin and the temporary protective material comprises a glob top polymer.

65. The method of claim 51, wherein the electrically insulating material comprises a flowable plastic material that is etchable by sulfuric acid or fuming sulfuric acid but is not etchable by nitric acid or fuming nitric acid.

66. The method of claim 65, wherein the electrically insulating material comprises a glob top polymer and the temporary protective material comprises an epoxy resin.

67. The method of claim 51, wherein the temporary protective material is selected from parylene, silicon nitride, metal, a vapor deposited organic material, cynoacrylate, a carbon film, a self-assembled monolayered material, perfluoropolyether, hexamethyidisilazane, or perfluorodecanoic carboxylic acid, silicon dioxide, silicate glass, or combinations thereof.

68. The method of claim 51, wherein the electrically insulating material comprises a water-soluble material, and further wherein perforating the electrically insulating material comprises using water as an etching fluid.

69. A method for activating at least one sensitive area of a microelectronic device, comprising, in the order presented:
   a) providing a microelectronic device comprising a sensitive area disposed on a substrate, wherein the sensitive area comprises an inner surface facing towards the substrate and an outer surface facing away from the substrate; and wherein the microelectronic device further comprises a layer of electrically insulating material disposed on and touching said outer surface of the sensitive area, wherein the outer surface of the sensitive area is covered and protected by the electrically insulating material;
   b) performing at least one packaging step; and
   c) perforating a sufficient amount of the layer of electrically insulating material to selectively expose at least part of the outer surface of the sensitive area to the surrounding environment by using a non-ablative material removal process to remove some, but not all, of the layer of electrically insulating material; whereby said at least part of the outer surface of the sensitive area becomes activated by exposing said at least part of the outer surface of the sensitive area to the surrounding environment.

70. A method for activating at least one sensitive area of a microelectronic device, comprising, in the order presented:

a) providing a microelectronic device comprising a sensitive area disposed on a substrate, wherein the sensitive area comprises an inner surface facing towards the substrate and an outer surface facing away from the substrate; and wherein the microelectronic device further comprises a first layer comprising a temporary protective material disposed on and touching said outer surface of the sensitive area, wherein the outer surface of the sensitive area is covered and protected by the temporary protective material; and further wherein the temporary protective material is substantially encased in a second layer comprising an electrically insulating material that is different than the temporary protective material;

b) perforating a sufficient amount of the second layer of electrically insulating material to provide access to the first layer of temporary protective material; and c) exposing at least part of the outer surface of the sensitive area to the surrounding environment by using a non-ablative material removal process to selectively remove at least some of the first layer of temporary protective material; whereby said at least part of the outer surface of the sensitive area becomes activated by exposing said at least part of the outer surface of the sensitive area to the surrounding environment.

71. A method for activating at least one sensitive area of a microelectronic device, comprising, in the order presented:

a) providing a microelectronic device comprising a sensitive area disposed on a substrate, wherein the sensitive area comprises an inner surface facing towards the substrate and an outer surface facing away from the substrate;

b) applying a temporary protective material on and touching said outer surface of the sensitive area;

c) performing at least one packaging step;

d) substantially encasing the temporary protective material in a second layer comprising an electrically insulating material that is different than the temporary protective material;

e) perforating a sufficient amount of the second layer of electrically insulating material to provide access to the first layer of temporary protective material; and f) exposing at least part of the outer surface of the sensitive area to the surrounding environment by using a non-ablative material removal process to selectively remove at least some of the first layer of temporary protective material; whereby said at least part of the outer surface of the sensitive area becomes activated by exposing said at least part of the outer surface of the sensitive area to the surrounding environment.

72. The method of claim 71, wherein performing at least one packaging step comprises cutting vias through the temporary protective material to expose bond pads before performing step d).

73. The method of claim 72, further comprising attaching wirebonds to through said vias said exposed bond pads before performing step d).

74. The method of claim 71, wherein performing at least one packaging step comprises attaching the substrate to a lead frame before performing step d).

75. The method of claim 71, wherein performing at least one packaging step comprises attaching the substrate to a package before performing step d).

76. The method of claim 75, further comprising attaching wirebonds to the microelectronic device after attaching the substrate to a package, but before performing step d).

77. The method of claim 76, wherein perforating a sufficient amount of the second layer of electrically insulating material in step e) does not include removing electrically insulating material from around the wirebonds.

78. The method of claim 76, wherein the package comprises a cofired ceramic multilayered body with metallized conductive traces interconnecting wirebonds to external bonding pads.

79. A method of packaging a MEMS device, comprising, in the order presented:

a) providing a wafer comprising a plurality of unreleased MEMS devices fabricated on the wafer;

b) releasing the MEMS elements;

c) applying a first layer comprising a temporary protective material to the released MEMS elements;

d) singulating the wafer into a plurality of individual dies each comprising a MEMS device covered by the temporary protective material;

e) attaching the die and wirebonding the MEMS device;

f) substantially encasing at least the temporary protective material in a second layer comprising an electrically insulating material that is different than the temporary protective material;

g) perforating a sufficient amount of the second layer of electrically insulating material to provide access to the first layer of temporary protective material, while not removing electrically insulating material from the wirebonds; and h) exposing and releasing the temporarily protected MEMS elements by using a non-ablative material removal process to selectively remove the temporary protective material; thereby activating the MEMS device.

80. The method of claim 79, wherein step e) comprises attaching the die to a paddle of a lead frame, and then wirebonding the device to electrical leads of the lead frame.

81. The method of claim 80, wherein step f) comprises transfer molding and encapsulating the temporarily protected MEMS device, the die, the paddle, the wirebonds, and at least part of the lead frame in a flowable dielectric material.

82. The method of claim 80, wherein step f) comprises pouring a flowable dielectric material into the package, thereby encapsulating the temporarily protected MEMS device, the die, and the wirebonds.

83. The method of claim 79, wherein step e) comprises attaching the die to a package, and then wirebonding the device to bonding locations on the package.

84. The method of claim 83, wherein the package comprises a cofired ceramic multilayered package.

85. The method of claim 79, further comprising applying an anti-stiction coating to the released MEMS elements, after completing the release step h).

86. The method of claim 79, wherein the temporary protective coating comprises parylene.

87. The method of claim 86, further comprising using a dry plasma etch in step h) to remove the parylene temporary protective coating.

88. The method of claim 79, further comprising using a acid etch decapsulator to selectively remove a portion of the electrically insulating material above MEMS device in step g).

* * * * *